(12) United States Patent
Iida et al.

(10) Patent No.: US 6,915,183 B2
(45) Date of Patent: Jul. 5, 2005

(54) SUBSTRATE PROCESSING APPARATUS AND METHOD OF ALIGNING SUBSTRATE CARRIER APPARATUS

(75) Inventors: Naruaki Iida, Koshi-machi (JP); Kazuhiko Ito, Koshi-machi (JP); Michio Kinoshita, Koshi-machi (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/854,163

(22) Filed: May 27, 2004

(65) Prior Publication Data

US 2004/0253091 A1 Dec. 16, 2004

(30) Foreign Application Priority Data

Jun. 16, 2003 (JP) ...................................... 2003-171266

(51) Int. Cl.$^7$ ................................................. G06F 7/00
(52) U.S. Cl. ........................ 700/218; 700/259; 414/939; 414/941; 901/47
(58) Field of Search .................................. 700/213, 218, 700/214, 245, 259; 414/935, 939, 941; 901/47

(56) References Cited

U.S. PATENT DOCUMENTS

| | | | | |
|---|---|---|---|---|
| 5,695,562 A | * | 12/1997 | Mizosaki ..................... | 118/712 |
| 5,725,664 A | | 3/1998 | Nanbu et al. | |
| 5,783,834 A | * | 7/1998 | Shatas .................... | 250/559.33 |
| 5,981,966 A | * | 11/1999 | Honma ................... | 250/559.33 |
| 6,054,181 A | | 4/2000 | Nanbu et al. | |
| 6,543,988 B2 | * | 4/2003 | Hsiao et al. ............. | 414/744.5 |
| 6,591,160 B2 | * | 7/2003 | Hine et al. ................... | 700/218 |
| 6,614,201 B2 | * | 9/2003 | Saino et al. ........... | 318/568.11 |
| 6,692,049 B2 | * | 2/2004 | Holbrooks ............... | 294/103.1 |
| 6,752,585 B2 | * | 6/2004 | Reimer et al. .............. | 414/783 |

* cited by examiner

*Primary Examiner*—Khoi H Tran
(74) *Attorney, Agent, or Firm*—Rader, Fishman & Grauer PLLC

(57) ABSTRACT

The present invention has a first optical detection mark having a predetermined positional coordinate in a lateral direction with respect to a carrier opening of a processing unit through which a carrier apparatus enters and exits, a second optical detection mark having a predetermined positional coordinate in a vertical direction with respect to the carrier opening, and an optical sensor provided on the substrate carrier apparatus for detecting the first or second optical detection mark. The substrate carrier apparatus is rotated by a predetermined angle from a position of the substrate carrier apparatus where the optical sensor detects the first optical detection mark, and the substrate carrier apparatus is moved in the vertical direction by a predetermined amount of movement from a position of the substrate carrier apparatus where the optical sensor detects the second optical detection mark. After the substrate carrier apparatus faces the carrier opening of the processing unit, the substrate carrier apparatus is allowed to enter the processing unit to acquire in advance a precise transfer position when transferring a substrate to a predetermined position on a mounting table in the processing unit.

11 Claims, 15 Drawing Sheets

SUBSTRATE PROCESSING APPARATUS AND METHOD OF ALIGNING SUBSTRATE CARRIER APPARATUS

BACKGROUND OF THE INVENTION

1. Field of the Invention

The present invention relates to a substrate processing apparatus including a processing unit for performing predetermined processing for a substrate such as a semiconductor wafer, an LCD substrate (a glass substrate for a liquid crystal display) or the like and a substrate carrier apparatus for transferring the substrate to/from the processing unit, and a method of aligning a substrate carrier apparatus for aligning the substrate carrier apparatus with respect to the processing unit.

2. Description of the Related Art

In manufacturing processes of a semiconductor device, the photolithography technique is used in which a resist solution is applied to a substrate such as a semiconductor wafer (hereinafter, referred to as a wafer), and a resultant resist film is exposed to light using a photomask and developed, thereby creating a desired resist pattern on the substrate. Such processing is generally performed using a substrate processing apparatus constituted of a coating and developing apparatus for applying and developing a resist solution and an aligner connected thereto.

To reduce the area occupied by the apparatus while ensuring a high throughput, the aforementioned substrate processing apparatus has the required number of units for each processing, the unit being a processing apparatus unitized to perform each of different plural processing such as coating treatment, developing treatment, heating and cooling processing, and so on for a substrate, and further has a carrier apparatus for carrying the substrate into/out of each unit.

The substrate processing apparatus described above will be briefly described taking, for example, a coating and developing apparatus shown in FIG. 14 as an example. A carrier 10 housing, for example, 25 wafers W is carried into a carrier stage 11, and the wafers W are taken out by a transfer arm 12 and carried to a processing block 14 via a transfer unit of a shelf unit 13a. In the processing block 14, a carrier apparatus 15 is provided at the center, around which a coating unit 16a for applying a coating solution to the wafer W, a developing unit 16b for performing developing treatment for a wafer after exposure, and shelf units 13a, 13b, and 13c including a heating unit and a cooling unit for performing predetermined heating processing and cooling processing for the wafer W before and after the treatments in the coating unit 16a and the developing unit 16b are provided.

The carrier apparatus 15 is for transferring the wafer W to/from the coating unit 16a, the developing unit 16b, and each of the processing units provided in the shelf units 13a to 13c in the processing block 14, and configured to be ascendable and descendable, rotatable about the vertical axis and movable back and forth.

Each unit such as the coating unit 16a, the developing unit 16b, or the like is housed, for example, in a container 17 as shown in FIG. 15, and the wafer W is transferred to/from a mounting table (not shown) for a wafer W provided inside the container 17 through a carrier opening 18 formed in a face of the container 17 opposed to the carrier apparatus 15.

Incidentally, in the above-described apparatus, it is required to mount the wafer W with high accuracy within a predetermined mounting region of each processing unit by the carrier apparatus 15 through the carrier opening 18 in order to perform accurate processing for the wafer W in each processing unit. To prevent particles from entering from a carrier path in this event, the carrier opening 18 is formed in the smallest possible size for an arm of the carrier apparatus 15 holding the wafer W to be able to enter and exit. Therefore, the carrier apparatus 15 cannot smoothly enter the inside of the processing unit such that the wafer W and the carrier apparatus 15 tend to collide with a region in the vicinity of the carrier opening 18. Therefore, to prevent the collision, an operation is performed at the time of initial setting of a system such as confirming the position of the carrier opening 18 of each processing unit in advance and causing the carrier apparatus 15 to learn, for example, an entrance/exit position of its arm with respect to the carrier opening 18 when carrying the wafer W into/out of the processing unit. This operation is generally called teaching and performed by manual operation of an operator.

It is very troublesome and takes much time, however, to perform the teaching operation of the carrier apparatus 15 for the carrier openings 18 of all the processing units by manual operation of the operator, and therefore the present inventor considers a configuration of automatically detecting the carrier opening 18 of a processing unit and aligning the carrier opening 18 with the carrier apparatus 15. As the configuration of automatically aligning the carrier apparatus 15 with the processing unit in the above-described manner, there is a proposed configuration disclosed in Japanese Patent Application Laid-open No. 2001-117064.

In this configuration, as shown in FIG. 16, alignment marks 110 are placed on front faces of processing units 100 with the positional relation with respect to actual transfer positions of the processing units 100 being grasped in advance, while a CCD camera 130 placed on a carrier apparatus 120 reads the alignment mark 110 in a predetermined positional relation, so that based on the detected data the position of the carrier apparatus 120 when transferring a substrate to the processing unit 100 is calculated, and based on the calculated positional data the entrance position of the substrate of the carrier apparatus 120 into the processing unit 100 and the transfer position of the substrate are corrected.

In the configuration disclosed in the aforementioned document, the carrier apparatus 120 can detect the position of the alignment mark 110 since it is configured to be movable in the vertical direction (a z-direction) of a carrier opening 140 of the processing unit 100 and movable in the lateral direction (a y-direction) of the carrier opening 140 and employs a CCD camera 130. However, in consideration of the type of carrier apparatus which moves to rotate about the vertical axis such as the carrier apparatus 15 of the above-described substrate processing apparatus in place of the carrier apparatus 120, this type of carrier apparatus cannot move along the lateral direction of the carrier opening 140. Accordingly, it is possible to precisely grasp the positional relation in the vertical direction of the carrier opening 140 but hard to precisely grasp the positional relation in the lateral direction and difficult to perform accurate teaching. Further, there is another problem that the CCD camera 130 used as a detecting means of the alignment mark 110 is expensive.

Further, in the configuration of the aforementioned document, the entrance position into the processing unit 100 and the transfer position of the carrier apparatus 120 are corrected based on the alignment mark 110 of the processing unit 100, but it is difficult to mount the wafer on the spin chuck being a mounting section of, for example, the coating unit with the rotation center of the spin chuck being precisely aligned with the center of the wafer by this alignment method.

This is because although the rotation center of the spin chuck can be roughly aligned with the center of the wafer based on the aforementioned mark position by obtaining the relative positional relation between the center position of the spin chuck and the position of the alignment mark 110 for each processing unit 100 in advance, the center of the spin chuck and the center of the rotation axis do not always coincide with each other but may slightly differ from each other due to parts error and assembly error of the spin chuck itself.

In the coating unit, treatment called edge rinse for cleaning by supplying a cleaning solution from a cleaning solution nozzle to the edge of the wafer with the wafer being rotated about the vertical axis is performed after application of the coating solution onto the front face of the wafer. In this event, there may appear a portion where the edge is not cleaned and a portion where the edge is cleaned in a width equal to or greater than a predetermined width if the center of the wafer is displaced from the rotation center of the spin chuck. It is desired to keep a device region of a wafer as large as possible, for example, to bring a device region up to a position not more than 1 mm from the edge. For this purpose, it is necessary to align the wafer center with the rotation center of the spin chuck at an accuracy within, for example, several tens $\mu$m, but it is difficult to align the wafer center with the rotation center of the spin chuck at an accuracy within several tens $\mu$m in the configuration of the aforementioned document, failing to accept this desire.

SUMMARY OF THE INVENTION

The present invention has been developed in view of the above situation, and an object thereof is to provide a substrate processing apparatus in which when a substrate carrier apparatus which is rotatable about a vertical axis, movable back and forth, and ascendable and descendable is used to transfer a substrate to a mounting table in a processing unit, the substrate carrier apparatus can be accurately aligned with a predetermined position on the mounting table in the processing unit, and a method of aligning the substrate carrier apparatus.

A substrate processing apparatus according to the present invention comprises a substrate carrier apparatus rotatable about a vertical axis, movable back and forth, and ascendable and descendable; towers placed along a rotational direction of the substrate carrier apparatus, each of the towers being constituted of a plurality of processing units tiered; and a carrier opening formed in an exterior casing of each of the processing units for allowing the substrate carrier apparatus holding a substrate to be carried into/out of each of the processing units, for acquiring data on a transfer position of the substrate carrier apparatus with respect to a predetermined position on a mounting table in the processing unit in adjusting said apparatus (the substrate processing apparatus or the substrate carrier apparatus, for example).

The substrate processing apparatus according to the present invention comprises a first optical detection mark provided on an outer surface of the exterior casing and having a predetermined positional coordinate in a lateral direction with respect to the carrier opening; and a second optical detection mark provided on the outer surface of the exterior casing and having a predetermined positional coordinate in a vertical direction with respect to the carrier opening; and an optical sensor provided on the substrate carrier apparatus for detecting the first or second optical detection mark.

The substrate processing apparatus according to the present invention further comprises a control unit including a program of rotating the substrate carrier apparatus by a predetermined angle from a position of the substrate carrier apparatus where the optical sensor detects the first optical detection mark, and moving the substrate carrier apparatus in the vertical direction by a predetermined amount of movement from a position of the substrate carrier apparatus where the optical sensor detects the second optical detection mark, to allow the substrate carrier apparatus to face the carrier opening of the processing unit; and a program of allowing the substrate carrier apparatus to enter the processing unit after the substrate carrier apparatus faces the carrier opening and to perform an operation of acquiring data on a precise transfer position when transferring the substrate to the predetermined position on the mounting table.

In the present invention, implemented are the steps of:

detecting a first optical detection mark provided on an outer surface of the exterior casing and having a predetermined positional coordinate in a lateral direction with respect to the carrier opening by an optical sensor provided on the substrate carrier apparatus to find a correction angle in the lateral direction from a position of the substrate carrier apparatus where the optical sensor detects the first optical detection mark to a transfer position where the substrate carrier apparatus faces the carrier opening of the processing unit;

detecting a second optical detection mark provided on the outer surface of the exterior casing and having a predetermined positional coordinate in a vertical direction with respect to the carrier opening by the optical sensor provided on the substrate carrier apparatus to find a correction amount in the vertical direction from a position of the substrate carrier apparatus where the optical sensor detects the second optical detection mark to the transfer position where the substrate carrier apparatus faces the carrier opening of the processing unit;

subsequently rotating the substrate carrier apparatus by the correction angle from the position of the substrate carrier apparatus where the optical sensor detects the first optical detection mark, and moving the substrate carrier apparatus in the vertical direction by the correction amount from the position of the substrate carrier apparatus where the optical sensor detects the second optical detection mark, to allow the substrate carrier apparatus to face the carrier opening of the processing unit; and allowing the substrate carrier apparatus to enter the processing unit after the substrate carrier apparatus faces the carrier opening and to perform an operation of acquiring data on a precise transfer position when transferring the substrate to the predetermined position on the mounting table.

According to another aspect of the present invention, a substrate processing apparatus of the present invention comprises:

a first optical detection mark provided on an outer surface of the exterior casing and having a predetermined positional coordinate in a lateral direction with respect to the carrier opening; and an optical sensor provided on the substrate carrier apparatus for detecting the first optical detection mark; and a control unit including a program of rotating the substrate carrier apparatus by a predetermined angle from a position of the substrate carrier apparatus where the optical sensor detects the first optical detection mark, and moving the substrate carrier apparatus in the vertical direction by a predetermined amount of movement from a position of the substrate carrier apparatus where the optical sensor detects edge portions in the vertical direction of the carrier opening, to allow the substrate carrier apparatus to face the carrier opening of the processing unit; and a program of allowing the substrate carrier apparatus to enter the processing unit after the substrate carrier apparatus faces the carrier opening and to perform an operation of acquiring data on a precise transfer position when transferring the substrate to the predetermined position on the mounting table.

In such an apparatus, implemented are the steps of:

detecting a first optical detection mark provided on an outer surface of the exterior casing and having a predetermined positional coordinate in a lateral direction with respect to the carrier opening by an optical sensor provided on the substrate carrier apparatus to find a correction angle in the lateral direction from a position of the substrate carrier apparatus where the optical sensor detects the first optical detection mark to a transfer position where the substrate carrier apparatus faces the carrier opening of the processing unit;

detecting edge portions in the vertical direction of the carrier opening by the optical sensor provided on the substrate carrier apparatus to find a correction amount in the vertical direction from a position of the substrate carrier apparatus where the optical sensor detects the edge portions in the vertical direction of the carrier opening to the transfer position where the substrate carrier apparatus faces the carrier opening of the processing unit;

subsequently rotating the substrate carrier apparatus by the correction angle from the position of the substrate carrier apparatus where the optical sensor detects the first optical detection mark, and moving the substrate carrier apparatus in the vertical direction by the correction amount from the position of the substrate carrier apparatus where the optical sensor detects the edge portions in the vertical direction of the carrier opening, to allow the substrate carrier apparatus to face the carrier opening of the processing unit; and allowing the substrate carrier apparatus to enter the processing unit after the substrate carrier apparatus faces the carrier opening and to acquire data on a precise transfer position when transferring the substrate to the predetermined position on the mounting table.

In the above invention, for example, the first or second optical detection mark is detected by the optical sensor attached to the substrate carrier apparatus so that the position of the carrier opening is confirmed based on the mark to find the transfer position where the substrate carrier apparatus faces the carrier opening of the processing unit, subsequently the substrate carrier apparatus is allowed to enter the processing unit at the transfer position to further performed the operation of acquiring data on the precise transfer position when the substrate is transferred to the predetermined position on the mounting table, so that the alignment of the substrate carrier apparatus with the processing unit can be accurately performed.

DETAILED DESCRIPTION OF THE INVENTION

Figure 1:
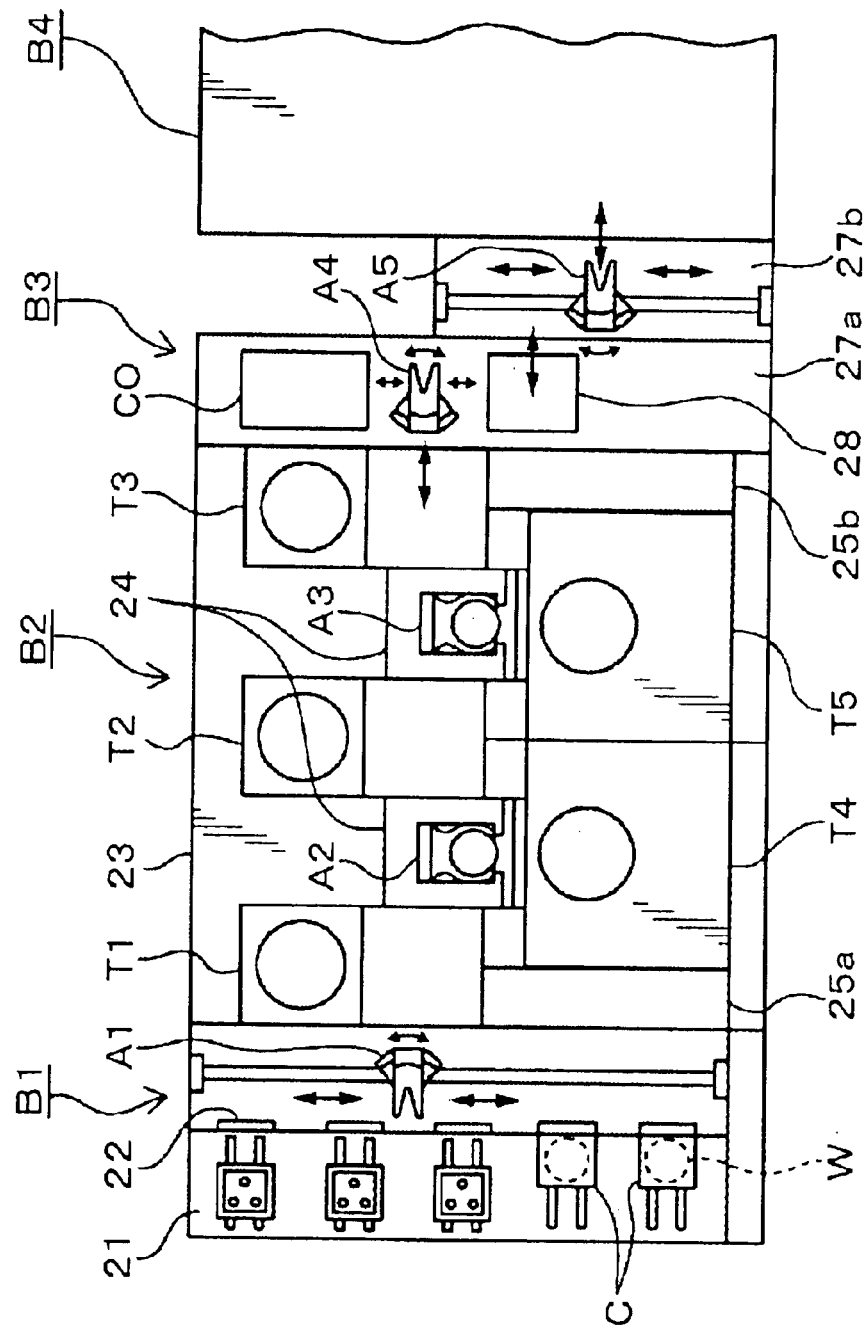
FIG. 1 is a plan view showing an entire configuration of an embodiment of a substrate processing apparatus according to the present invention.
Figure 2:
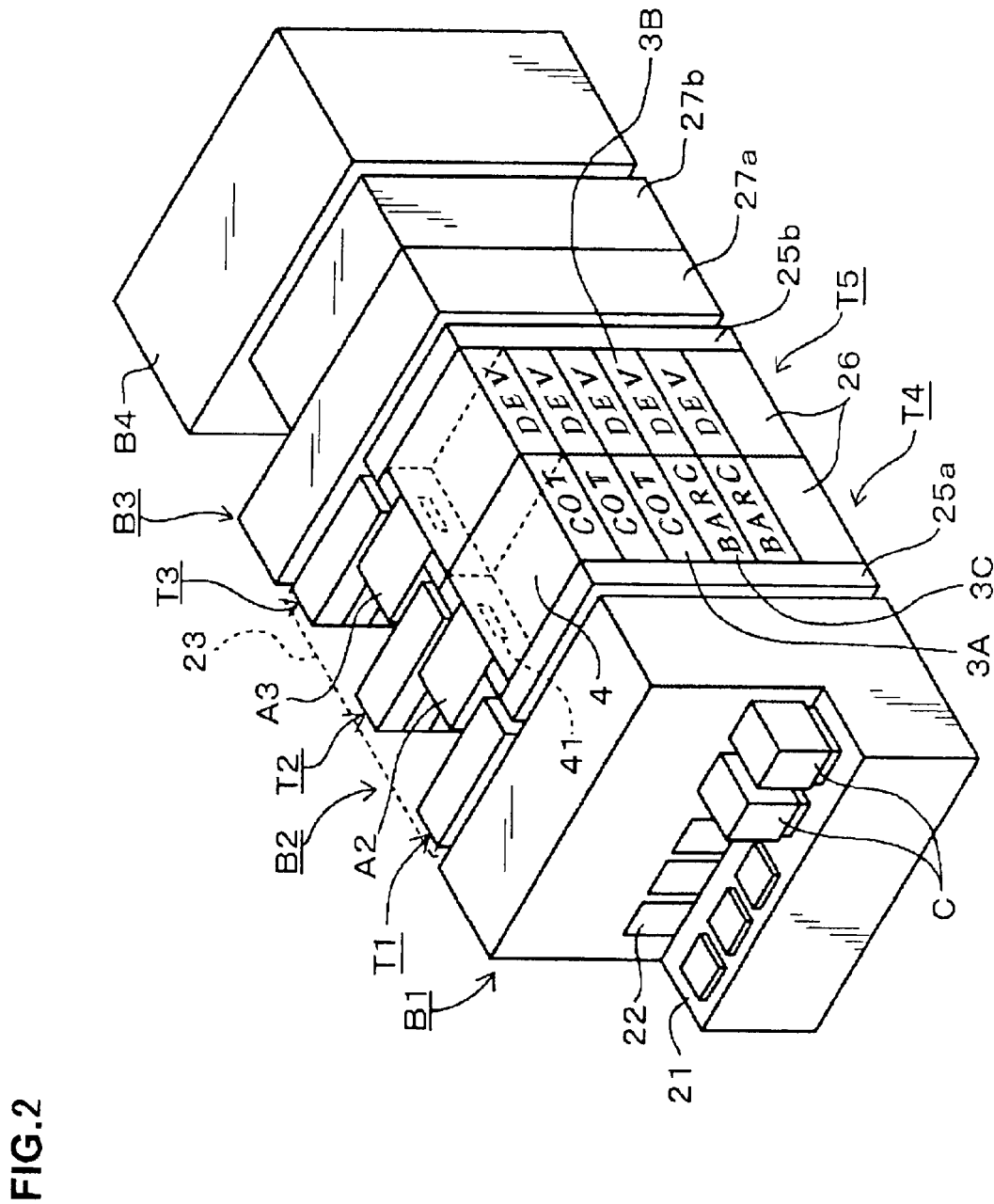
FIG. 2 is a perspective view showing an external appearance of the substrate processing apparatus in FIG. 1.

Hereinafter, a substrate processing apparatus of the present invention will be described in detail. FIG. 1 is a plan view of a substrate processing apparatus constituted of a coating and developing apparatus connected to an aligner, which is an embodiment of the present invention, and FIG. 2 is a perspective view of the same. In the drawings, B1 denotes a carrier mounting section for carrying in/out a carrier C hermetically housing, for example, 13 wafers W being substrates, in which a mounting table 21 capable of mounting thereon a plurality of carriers C; opening/closing portions 22 provided on a front wall face as seen from the mounting table 21; and a transfer means A1 for taking a wafer W from the carrier C via the opening/closing portion 22, are provided.

To the back side of the carrier mounting section B1, a processing section B2 surrounded by a casing 23 is connected, and three heating and cooling system towers T1, T2, and T3 in which processing units of heating and cooling system are multi-tiered and main carrier mechanisms A2 and A3 which are movable back and forth, ascendable and descendable, and rotatable about the vertical axes for transferring the wafer W among various processing units which will be described later are alternately arranged in order from the front side in the processing section B2. More specifically, the towers T1, T2, and T3 and the main carrier mechanisms A2 and A3 are arranged in a line behind each other as seen from the carrier mounting section B1 side, and not-shown opening portions for carrying the wafer are formed at respective connection portions therebetween, so that the wafer W can be freely moved in the processing section B2 from the tower T1 on one end side to the tower T3 on the other end side.

The main carrier mechanisms A2 and A3 are respectively placed in spaces surrounded by partition walls 24 each constituted of one face-portion on the side of the towers T1, T2, and T3 which are placed in the back-and-forth direction as seen from the carrier mounting section B1, one face-portion on the side of a solution treatment system tower T4 or T5 on the right in which processing units of solution treatment system are multi-tiered, and a back face-portion forming one face on the left side.

The main carrier mechanisms A2 and A3 constitute substrate carrier apparatuses in the present invention and are configured to be ascendable and descendable, movable back and forth, and rotatable about the vertical axes as will be described later. The aforementioned towers T1, T2, and T4 are placed along the rotational direction of the main carrier mechanism A2, and the towers T2, T3, and T5 are placed along the rotational direction of the main carrier mechanism A3, so that the main carrier mechanisms A2 and A3 have a function of carrying the wafer W among the processing units provided in these towers T1 to T5. However, the transfer means A1 is not illustrated in FIG. 2 for convenience. In the drawings, numerals 25a and 25b are, for example, temperature and humidity regulating units including a regulator of temperature or humidity, a pump, a duct, and so on.

As shown in FIG. 2, the solution treatment system towers T4 and T5 have a configuration in which, for example, coating units 3A (COT), developing units 3B (DEV), and antireflection film forming units 3C (BARC) are multi-tiered, for example, five-tiered on housing units 26 which form spaces for supplying chemicals such as a coating solution (resist) and a developing solution. These coating unit 3A, developing unit 3B, and antireflection film forming unit 3C are examples of the processing unit, and each of these processing units is surrounded by an exterior casing 4 whose face opposed to the main carrier mechanism A2 or A3 is formed with a carrier opening 41 for a wafer so that the main carrier mechanism A2 or A3 holding the wafer can enter therethrough.

In the heating and cooling system towers T1, T2, and T3, various kinds of processing units for performing preprocessing and postprocessing of the treatments in the solution system towers T4 and T5 are multi-tiered, for example, ten-tiered. The aforementioned processing units for performing preprocessing and postprocessing include the transfer unit and so on as well as the heating unit and cooling unit. Each of these processing units is also surrounded by an exterior casing whose face opposed to the main carrier mechanism A2 or A3 is formed with a carrier opening for a wafer so that the main carrier mechanism A2 or A3 holding the wafer can enter therethrough.

To the back side of the tower T3 in the processing block B2, an exposure section B4 is connected via an interface section B3 having, for example, a first carrier chamber 27a and a second carrier chamber 27b. Inside the interface section B3, in addition to two transfer means A4 and A5 for transferring the wafer W between the processing section B2 and the exposure section B4, a buffer cassette C0 temporarily housing a plurality of, for example, 25 wafers W and a transfer unit 28 for transferring the wafer between the transfer means A4 and A5 are provided.

The flow of a wafer W in the above-described apparatus will be briefly described here. First, when a cassette C housing the wafers W is mounted on the mounting table 21 from the outside, a lid of the cassette C is removed together with the opening/closing portion 22, and a wafer W is taken out by the transfer means A1. Then, the wafer W is transferred to the main carrier mechanism A2 via the transfer unit constituting one tier of the tower T1, in which an antireflection film being a film to prevent reflection of light during exposure is formed on the front face of the wafer, for example, in the antireflection film forming unit 3C in the tower T4 as preprocessing of, for example, the coating treatment, and thereafter coated with the resist solution in the coating unit 3A, whereby a predetermined resist film is formed.

After the resist film is formed on the front face of the wafer W, the wafer W is then transferred from the main carrier mechanisms A2 and A3 to the transfer unit in the tower T3 and via the transfer units A4 and A5 in the interface section B3 to the exposure section B4, where the wafer W is subjected to predetermined exposure processing. Note that before and after the wafer W is coated with the resist solution, it is subjected to, for example, heating processing and cooling processing in the processing units included in the towers T1 to T3.

After the exposure processing, the wafer W is carried to the main carrier mechanisms A2 and A3 in a reverse route, and subjected to development in the developing unit 3B, for example, in the tower T5. The wafer W formed with a predetermined resist pattern in this manner is returned, for example, to the original carrier C in the carrier mounting section B1 via the transfer unit in the tower T1. Note that before and after the development, the wafer W is subjected to preprocessing and postprocessing such as heating processing and cooling processing in the processing units in the towers T1 to T3.

Figure 3:
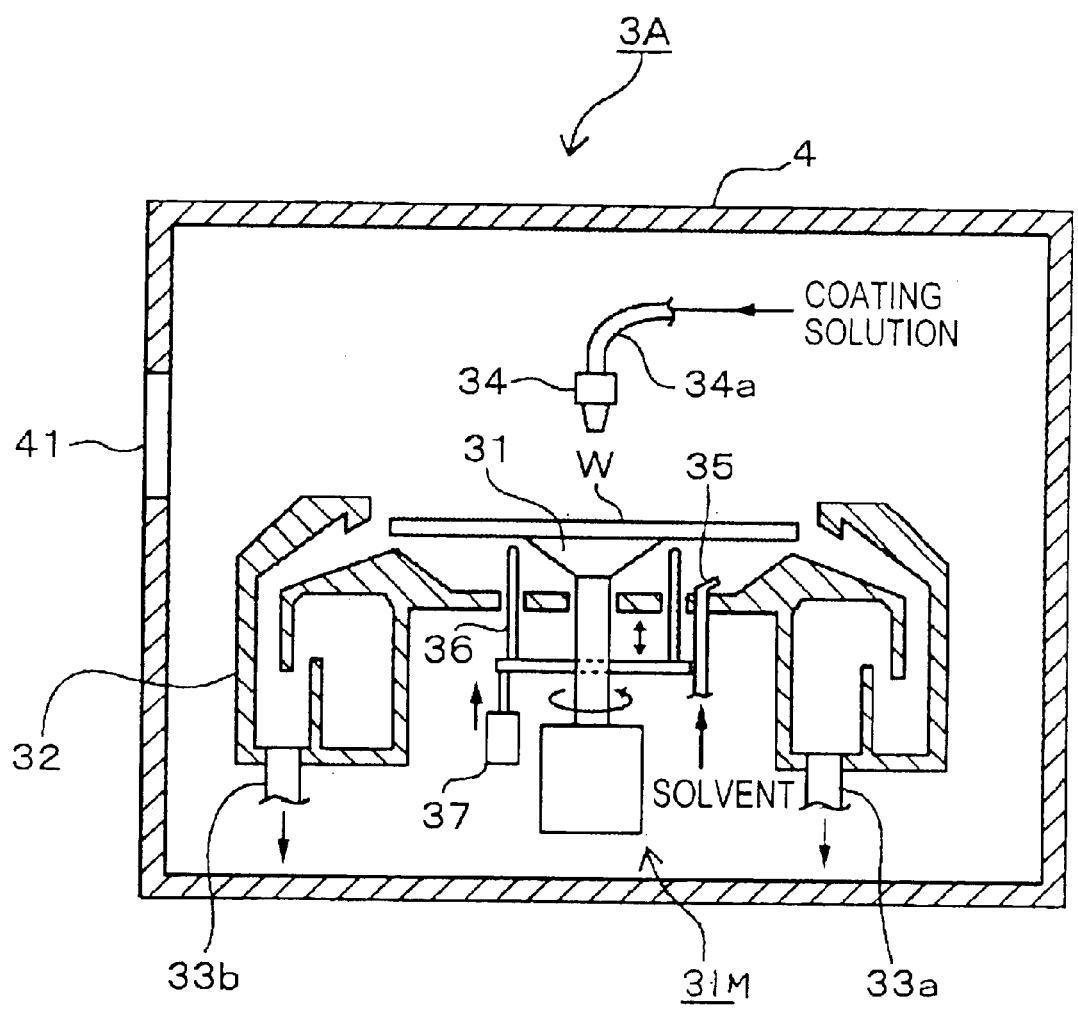
FIG. 3 is a cross-sectional view showing an example of a coating unit provided in the substrate processing apparatus in FIG. 1.

Subsequently, to describe an example of the above-described coating unit 3A with reference to FIG. 3, inside a processing container being the exterior casing 4 provided with the carrier opening 41 for carrying in/out the wafer, a spin chuck 31 being a mounting table is provided by which the wafer W is almost horizontally held by vacuum suction. The spin chuck 31 can be rotated about the vertical axis and raised and lowered by a drive unit 31M including a motor and a raising and lowering section. Further, a solution receiving cup 32 which surrounds the side portion extending from the wafer W to the spin chuck 31 and is formed with an recessed portion over the entire periphery on the lower side is provided around the spin chuck 31, and an exhaust pipe 33a and a drain pipe 33b are connected to a bottom face of the solution receiving cup 32.

Above the solution receiving cup 32, a supply nozzle 34 for supplying a resist solution being a coating solution, for example, to a position of almost rotation center of the wafer W is provided, and the nozzle 34 is connected to a not-shown coating solution tank for storing the coating solution via a coating solution supply path 34a. The supply nozzle 34 is configured to be movable between the position above the central portion of the wafer W and the outside of the solution receiving cup 32.

On the back face side of the wafer mounted on the spin chuck 31, a back rinse nozzle 35 for supplying a solvent of the coating solution to an edge region of the wafer is provided to remove a coating film (a resist film) attached to the back face of the wafer. The back rinse nozzle 35 is configured to be able to supply the solvent to a region ranging from, for example, the outer edge on the back face side of the wafer to, for example, about 50 mm inside from the edge. A numeral 36 in the drawing is a raising and lowering pin configured to be freely raised and lowered by a raising and lowering unit 37 to raise the wafer W from the spin chuck 31 so as to transfer the wafer W to/from the main carrier mechanisms A2 and A3.

In the coating apparatus 3A described above, when the spin chuck 31 is rotated at the preset number of rotations concurrently with dropping of the resist solution from the supply nozzle 34 to the front face of the wafer W on the spin chuck 31, the resist solution is spread in the radial direction of the wafer W by its centrifugal force so that a solution film of the resist solution is formed on the front face of the wafer W and the solution spun off flows down into the solution receiving cup 32.

After the solution film of the resist solution is formed on the front face of the wafer in this manner, the solvent of the resist solution is supplied from the edge rinse nozzle 35 to the edge region of the wafer while the wafer is being rotated at the predetermined number of rotations by the spin chuck 31, whereby unnecessary resist solution film within the edge region of the wafer is removed.

The developing unit 3B and the antireflection film forming unit 3C are also configured to hold a wafer on a spin chuck which is rotatable about the vertical axis and supply a developing solution or an antireflection film forming solution from a nozzle onto the front face of the wafer as in the above-described coating unit 3A.

Subsequently, a configuration in which an alignment method of the present invention is implemented will be described. First, the main carrier mechanisms A2 and A3 are described; these are configured in the same manner and thus the main carrier mechanism A2 will be described here as an example.

Figure 4:
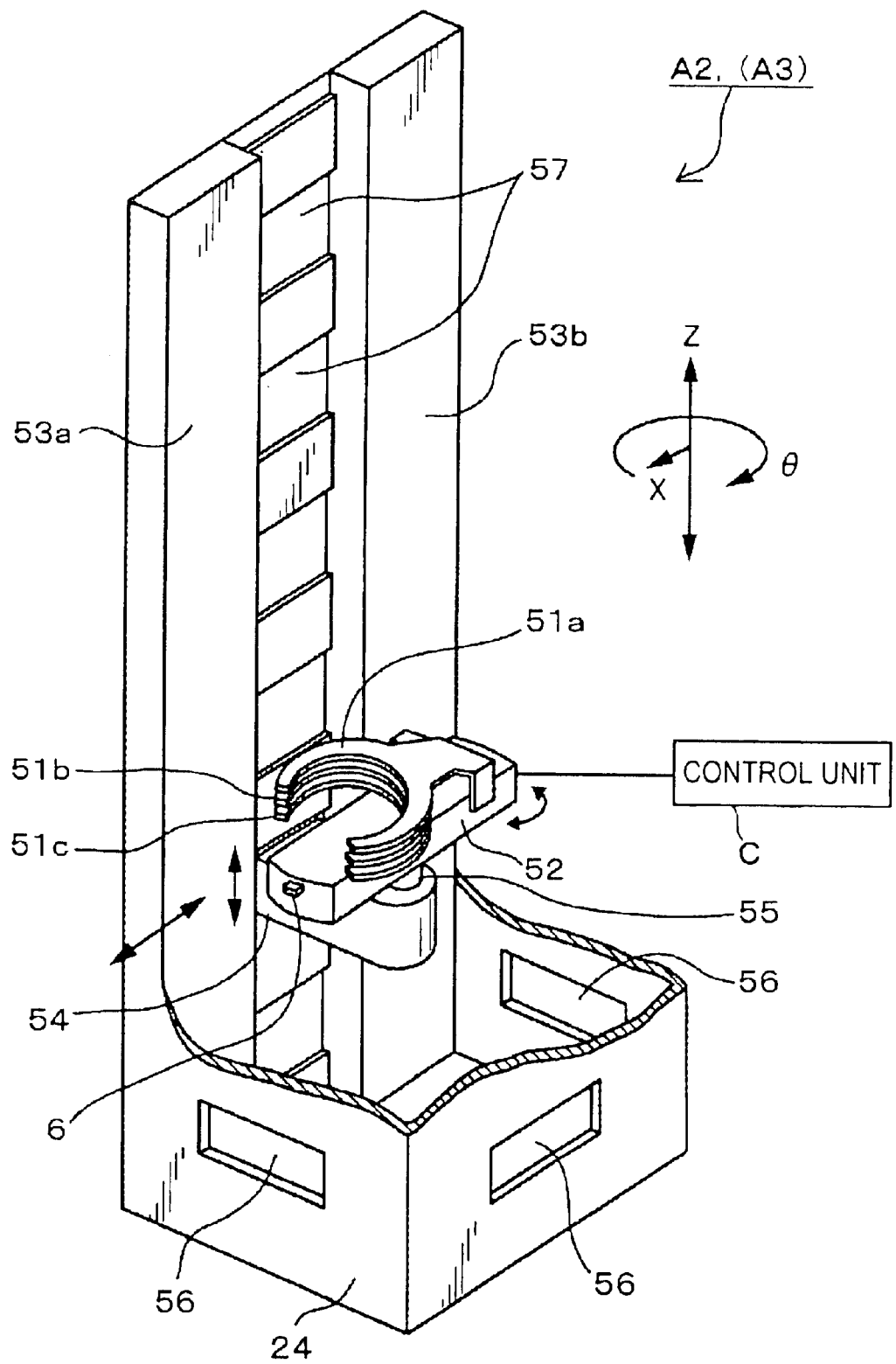
FIG. 4 is a perspective view showing an example of a main carrier mechanism provided in the substrate processing apparatus in FIG. 1.

The main carrier mechanism A2, as shown in FIG. 4, comprises an arm 51 (51a to 51c) holding a wafer W, a base 52 for supporting the arm 51, a raising and lowering mechanism 54 for supporting the base 52 in a manner to freely raise and lower it along a pair of guide rails 53a and 53b in a Z-direction in the drawing, and a rotation mechanism (not shown) for rotating the base 52 about the vertical axis in a θ-direction in the drawing via a rotation shaft 55 provided in the raising and lowering mechanism 54.

The arm 51 has a three-tier configuration capable of holding wafers W respectively and movable back and forth separately along the base 52 in an X-direction in the drawing by a back-and-forth moving mechanism (not shown). As a result, the arm 51 is configured to be ascendable and descendable in the Z-direction, rotatable in the θ-direction, and movable back and forth in the X-direction. Each of the main carrier mechanism A2 and A3 described above is housed inside the casing constituted of the partition wall 24 as already described, and an entrance/exit 56 for the arm is formed in a region of the casing corresponding to the carrier opening of each processing unit.

When alignment of the main carrier mechanism A2 or A3 is performed, an optical sensor 6 is attached to a predetermined position on the front face of the base 52. This optical sensor 6 comprises a light emitting sensor which irradiates with laser light or infrared light and a light receiving sensor which receives the light, and is attached to the base 52 with the positional relation between the optical sensor 6 and each arm 51 (51a to 51c) being grasped in advance. Driving the raising and lowering mechanism 54, the rotation mechanism, and the back-and-forth moving mechanism of the main carrier mechanism A2 and A3 described above is controlled by a control unit C of the substrate processing apparatus.

Figure 5:
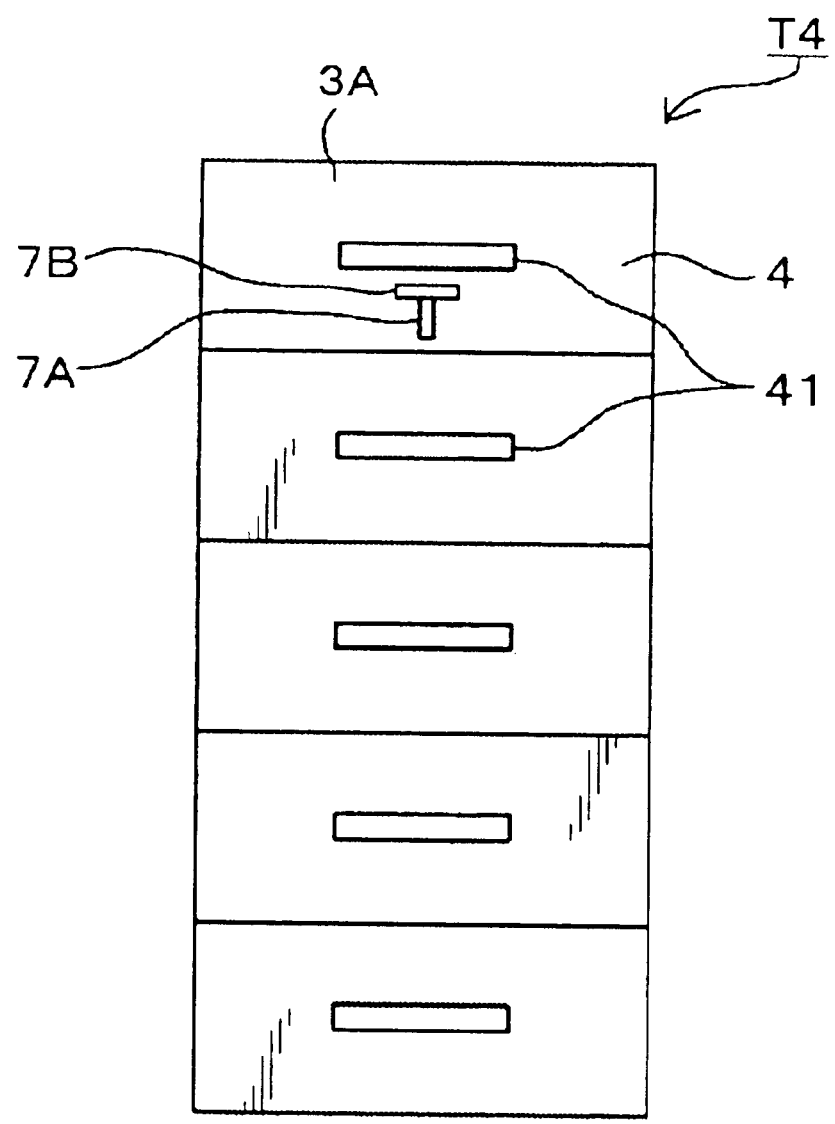
FIG. 5 is a front view showing an example of a tower provided in the substrate processing apparatus in FIG. 1.

Subsequently, the abovementioned towers T1 to T5 will be described. The exterior casing 4 of each of the processing units provided in the towers T1 to T5, is formed with the already-described carrier opening 41 as shown in FIG. 5 in which the tower T4 is taken as a representative, and the size of the carrier opening 41 is set to be a length L1 in the lateral direction (the width direction) of 380 mm and a length L2 in the vertical direction (the height direction) of about 65 mm (see FIG. 6).

Figure 6:
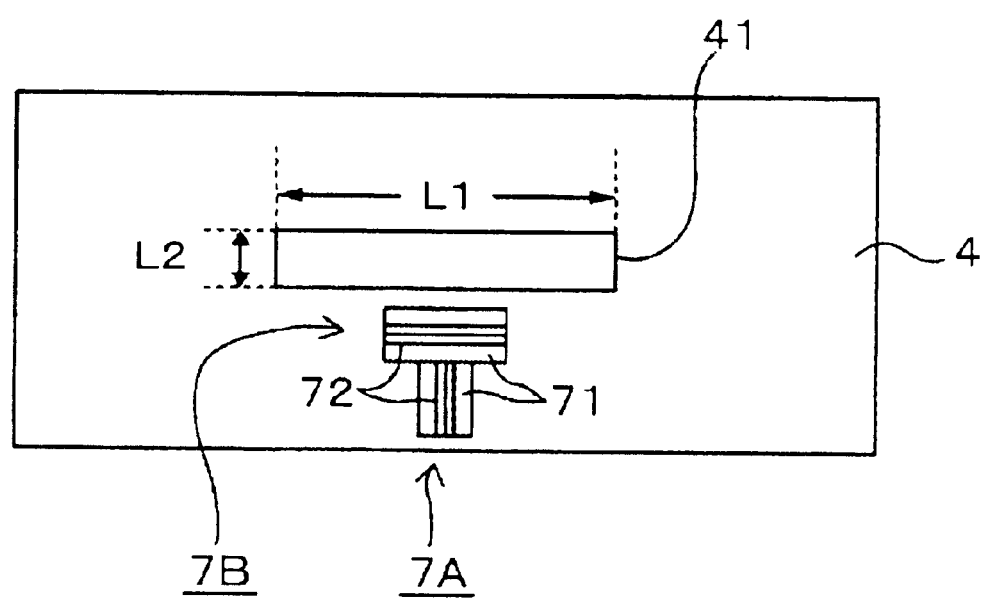
FIG. 6 is a front view showing a part of the tower in FIG. 5.

Further, a first optical detection mark (hereinafter, referred to as a "first mark") 7A and a second optical detection mark (hereinafter, referred to as a "second mark") 7B are provided at predetermined positions of an outer surface of the exterior casing 4 formed with the carrier opening 41. These first and second marks 7A and 7B are provided, for example, one for each of the towers T1 to T5, and the first and second marks 7A and 7B in the example shown in FIG. 5 and FIG. 6 are provided on the outer surface on a lower side of the carrier opening 41 in the exterior casing 4 of the coating unit 3A at the uppermost tier.

The first mark 7A is used as a mark defining a reference position in the lateral direction whose positional coordinate in the lateral direction is previously determined with respect to the carrier opening 41, and the second mark 7B is used as a mark defining a reference position in the vertical direction whose positional coordinate in the vertical direction is previously determined with respect to the carrier opening 41.

Figure 7A:
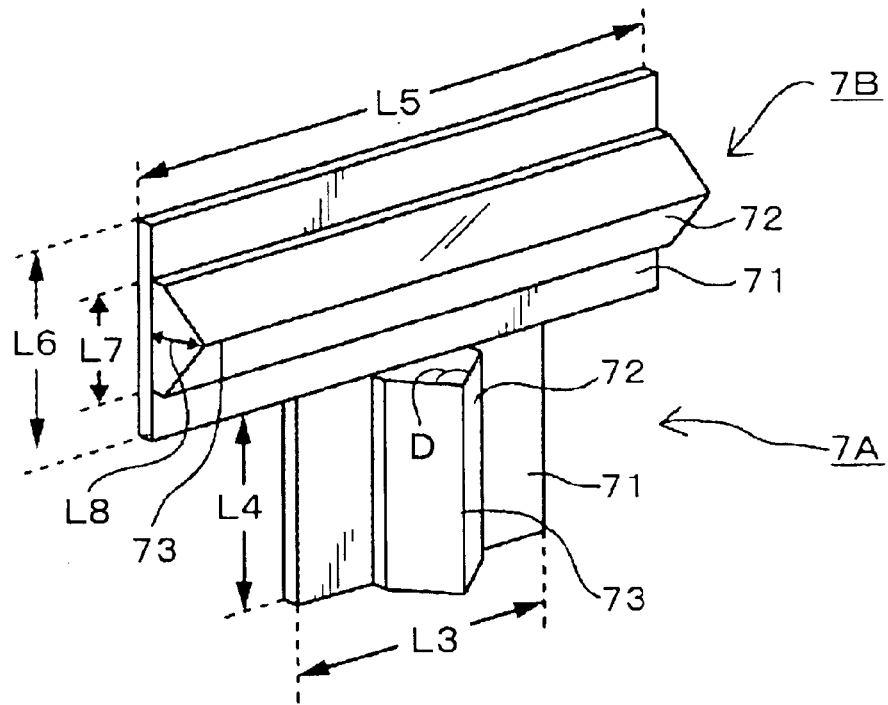
FIG. 7A is a perspective view showing a first optical detection mark and a second optical detection mark provided on the tower in FIG. 5.

Subsequently, the shape of the first and second marks 7A and 7B will be concretely described using a perspective view in FIG. 7A and a plan view in FIG. 7B. The first and second marks 7A and 7B are both similarly configured in shape, and therefore the first mark 7A will be described as an example here.

The first mark 7A has a configuration in which a protruding body 72 is provided along the vertical direction (the height direction) at the middle in the lateral direction (the width direction) of a plate-shaped diffuser panel 71, and the protruding body 72 is composed of, for example, an almost triangle pole having a top portion 73 protruding forward at the middle of the diffuser panel 71 and a side corresponding to the top portion 73 fixed to the diffuser panel 71, with both side faces of the top portion 73 being formed as lustrous faces. As described above, the protruding body 72 is configured such that where light is made incident on the diffuser panel 71 in a direction almost perpendicular thereto, both side faces of the top portion 73 are directed in oblique directions with respect to the incident direction of the light. The diffuser panel 71 is formed of, for example, aluminum plate, and the protruding body 72 is formed of, for example, an aluminum block.

Figure 7B:
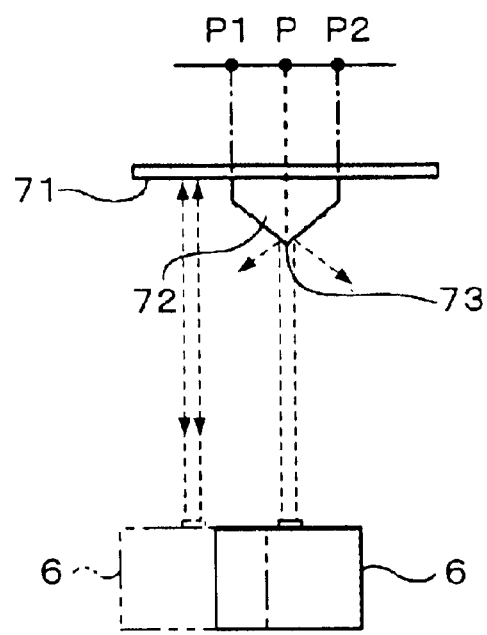
FIG. 7B is a plan view showing a reflection state at the first optical detection mark.

Such a configuration allows light emitted from the optical sensor 6 toward the first mark 7A to strike the protruding body 72 as shown in FIG. 7B and the light to be reflected in the oblique directions by both the side faces of the protruding body 72 with no reflected light returning to the optical sensor 6, when the optical sensor 6 is placed at a position directly opposed to the front of the protruding body 72 of the first mark 7A. On the other hand, when the optical sensor 6 is placed at a position off the front of the protruding body 72 of the first mark 7A, light emitted from the optical sensor 6 toward the first mark 7A strikes the diffuser panel 71 on either side of the protruding body 72, and is reflected by the diffuser panel 71 and returned to the optical sensor 6 to be received by the optical sensor 6. Accordingly, by detecting the presence or absence of reception of the reflected light, the presence or absence of the protruding body 72 will be detected.

Accordingly, the control unit C is configured to obtain the positional coordinates of positions P1 and P2 of both edge portions of the protruding body 72 in this event, calculate from these positional coordinates the positional coordinate of a center position P of the region where the protruding body 72 is provided, and calculate from the center position P the precise positional coordinate of the predetermined position of the carrier opening 41 of which the positional coordinate in the lateral direction with respect to the center position P has been determined in advance, so as to detect the first mark 7A by the optical sensor 6, whereby the precise positional coordinate in the lateral direction of the predetermined position of the carrier opening 41 can be obtained.

Since the first mark 7A is provided such that the length direction of the carrier opening 41 is perpendicular to the length direction of the protruding body 72, the precise positional coordinate in the lateral direction of the predetermined position of the carrier opening 41 can be obtained by detecting the first mark 7A by the optical sensor 6 as described above. On the other hand, the second mark 7B is provided such that the length direction of the carrier opening 41 is parallel to the length direction of the protruding body 72, and therefore the precise positional coordinate in the vertical direction of the predetermined position of the carrier opening 41 can be obtained by detecting the second mark 7B by the optical sensor 6 in the same manner.

The shape and size of the protruding body 72 of each of the first and second marks 7A and 7B are set so that reflected light of the light striking the protruding body 72 never returns to the optical sensor 6 but reflected light of the light striking a region other than the protruding body 72, for example, the diffuser panel 71 does return to the optical sensor 6. To take an example, the diffuser panel 71 of the first mark 7A has a length L3 in the lateral direction of 100 mm and a length L4 in the vertical direction of 30 mm, the diffuser panel 71 of the second mark 7B has a length L5 in the lateral direction of 100 mm and a length L6 in the vertical direction of 30 mm, and the protruding bodies 72 have a width L7 of 10 mm, a height L8 at the top portion 73 of 7 mm, and an angle D formed at the top portion 73 of 90 degrees.

Subsequently, an alignment method of the present invention will be described, and this alignment operation is for obtaining data on the transfer position of each of the main carrier mechanisms A2 and A3 with respect to a predetermined position on the mounting table in the processing unit in adjusting the apparatus. A case in which alignment of the main carrier mechanism A2 is performed with respect to the coating unit 3A which is provided at the uppermost tier in the tower T4 will be described here as an example by using FIG. 8 to FIG. 12.

Figure 8:
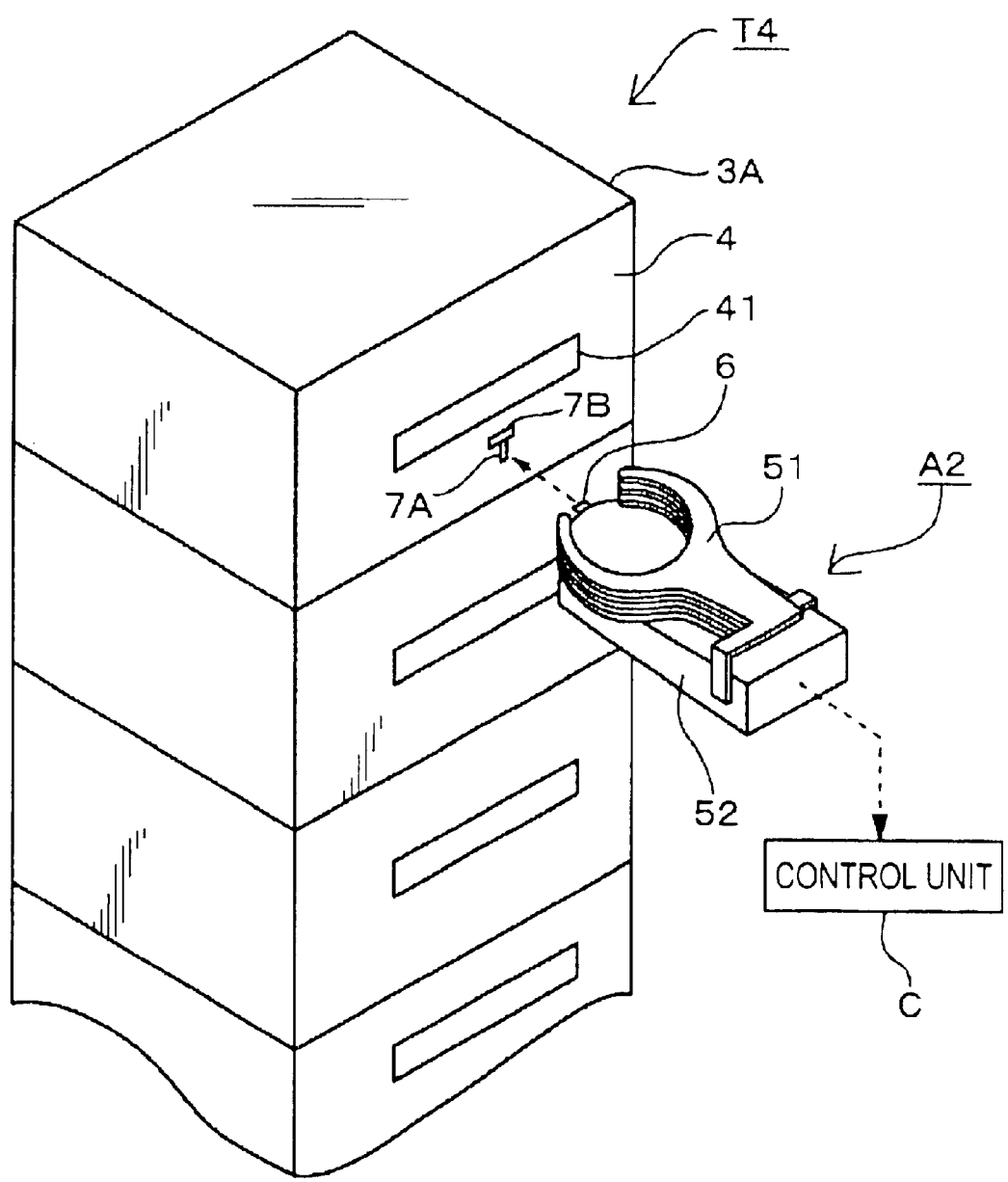
FIG. 8 is a perspective view showing the tower in FIG. 5 and the main carrier mechanism.
Figure 9:
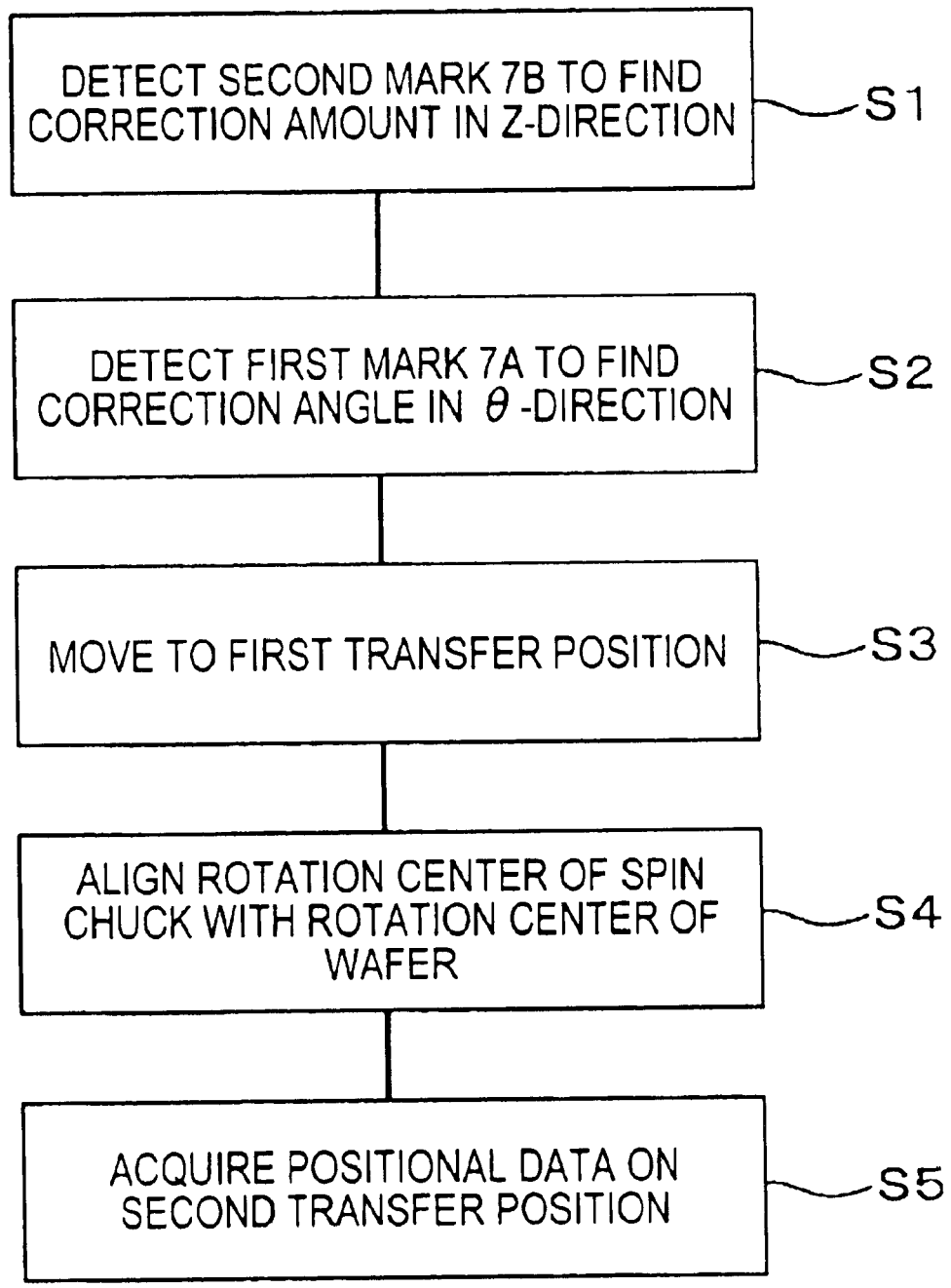
FIG. 9 is a flowchart for explaining an alignment operation of the main carrier mechanism performed in the substrate processing apparatus in FIG. 1.

First, the optical sensor 6 is attached to the main carrier mechanism A2, and the main carrier mechanism A2 is moved to the initial position corresponding to the above-described carrier opening 41 as shown in FIG. 8. This initial position is a preset position. At this initial position, the above-described optical sensor 6 then detects the second mark 7B of the tower T4 to find, based on the detection value, the correction amount in the vertical direction (the Z-direction) from the aforementioned initial position of the main carrier mechanism A2 for moving the main carrier mechanism A2 from the initial position to a first transfer position (Step S1, see FIG. 10). The aforementioned first transfer position is a position where the main carrier mechanism A2 faces the carrier opening 41 of the coating unit A3 and transfers the wafer W to a predetermined position on the spin chuck 31 of the coating unit A3.

Figure 10:
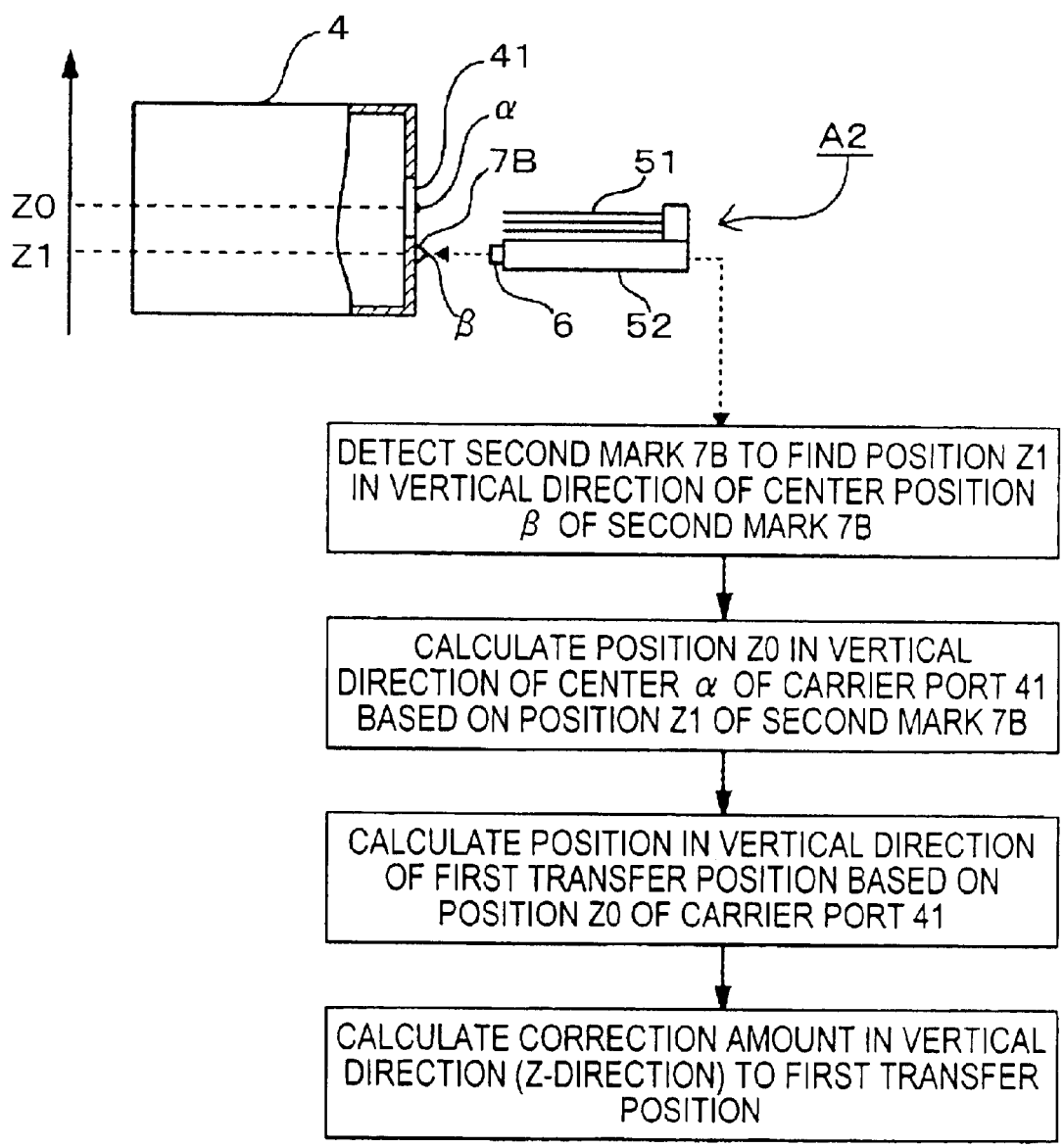
FIG. 10 is a side view for explaining the alignment operation.

Concrete description will be made using FIG. 10. The positional coordinates of the optical sensor 6 attached to the main carrier mechanism A2 and each arm 51 have been grasped in advance. Further, the positional coordinates in the vertical direction of a predetermined position, for example, a center position α of the carrier opening 41 and a predetermined position, for example, a center position β of the protruding body 72 of the second mark 7B have been determined in advance.

Then, for example, the optical sensor 6 detects both edge positions in the vertical direction of the protruding body 72 of the second mark 7B, and the control unit C finds a positional coordinate Z1 in the vertical direction (the Z-direction) of the center position β of the protruding body 72 of the second mark 7B based on the detection value. Subsequently, a positional coordinate Z0 in the vertical direction of the center position α of the carrier opening 41 is calculated based on the positional coordinate Z1 in the vertical direction of the center position β of the second mark 7B. In other words, since the positional relation in the vertical direction between the center position α of the carrier opening 41 and the center position β of the protruding body 72 of the second mark 7B has been determined in advance, the positional coordinate Z0 in the vertical direction of the center position α of the carrier opening 41 is found when the positional coordinate Z1 in the vertical direction of the center position β of the second mark 7B is determined.

Subsequently, the positional coordinate in the vertical direction of the first transfer position of the main carrier mechanism A2 facing the carrier opening 41 is calculated based on the positional coordinate Z0 in the vertical direction of the center position α of the carrier opening 41, based on which the correction amount in the vertical direction (the Z-direction) for moving the main carrier mechanism A2 from the initial position to the first transfer position is calculated.

Subsequently, the main carrier mechanism A2 is moved to the initial position to detect the first mark 7A of the tower T4 by the optical sensor 6, and a correction angle in the lateral direction (the θ-direction) of the main carrier mechanism A2 from the initial position for moving the main carrier mechanism A2 from the initial position to the first transfer position is found based on the detection value (Step S2, see FIG. 11).

Figure 11:
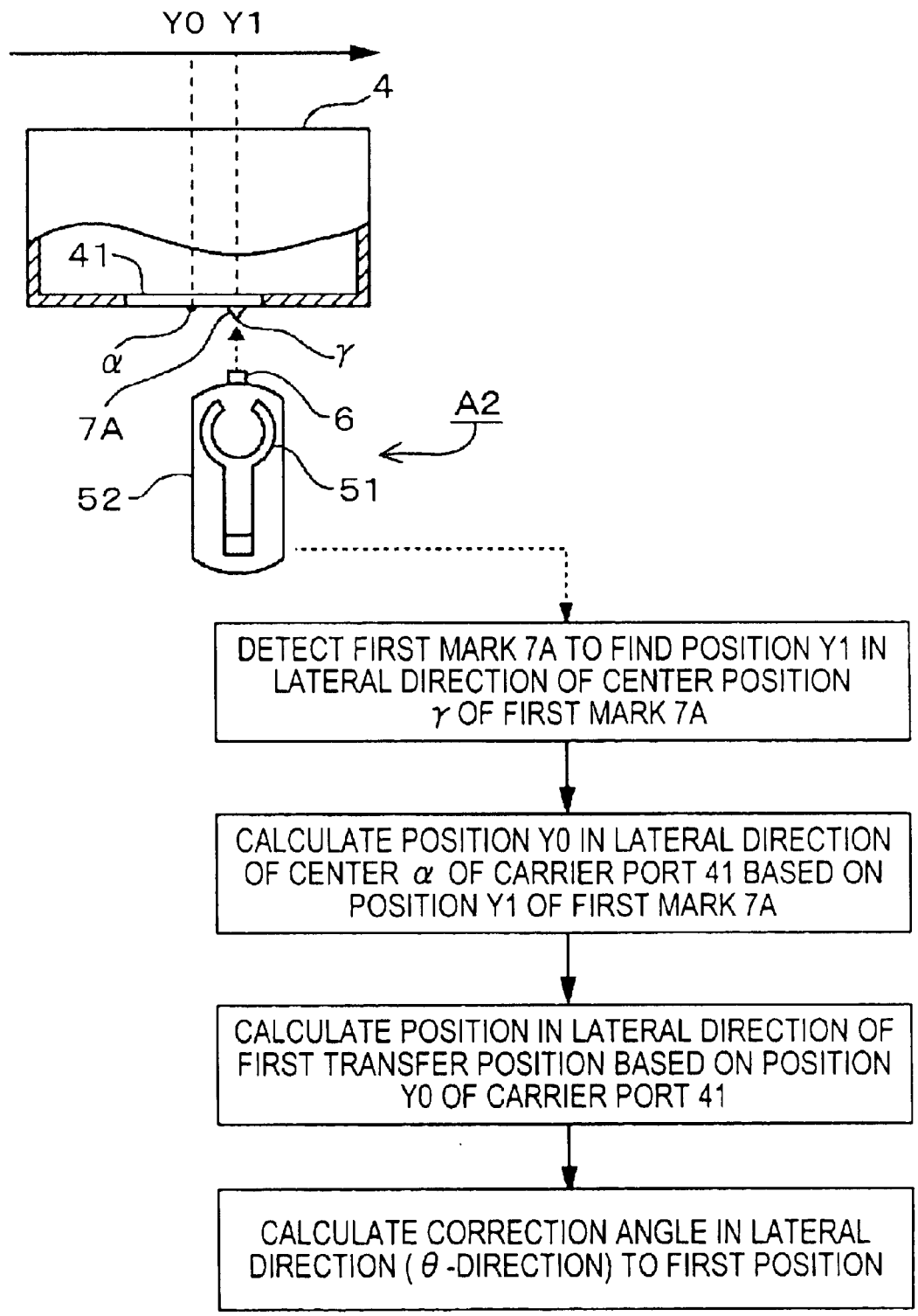
FIG. 11 is a plan view for explaining the alignment operation.

To make a concrete description using FIG. 11, the positional coordinates in the lateral direction of the predetermined position, for example, the center position α of the carrier opening 41 and a predetermined position, for example, a center position γ of the protruding body 72 of the first mark 7A have been determined in advance. Then, for example, the optical sensor 6 detects both edge positions in the lateral direction of the protruding body 72 of the first mark 7A, and the control unit C finds a positional coordinate Y1 in the lateral direction (the θ-direction) of the center position γ of the protruding body 72 of the first mark 7A based on the detection value.

Subsequently, a positional coordinate Y0 in the lateral direction of the center position α of the carrier opening 41 is calculated based on the positional coordinate Y1 in the lateral direction of the center position γ of the first mark 7A. In other words, since the positional relation in the lateral direction between the center position α of the carrier opening 41 and the center position γ of the protruding body 72 of the first mark 7A has been determined in advance, a positional coordinate Y0 in the lateral direction of the center position α of the carrier opening 41 is found when the positional coordinate Y1 in the lateral direction of the center position γ of the first mark 7A is determined.

Subsequently, the positional coordinate in the θ-direction of the first transfer position of the main carrier mechanism A2 facing the carrier opening 41 is calculated based on the positional coordinate Y0 in the lateral direction of the center position α of the carrier opening 41, based on which a correction angle in the θ-direction for moving the main carrier mechanism A2 from the initial position to the first transfer position is calculated.

After the positional coordinate of the first transfer position is found in the above manner, the main carrier mechanism A2 holding the wafer is moved in the vertical direction from the initial position by the found correction amount and rotated in the θ-direction from the initial position by the found correction angle, so that the main carrier mechanism A2 is moved to the first transfer position (Step S3).

Figure 12A:
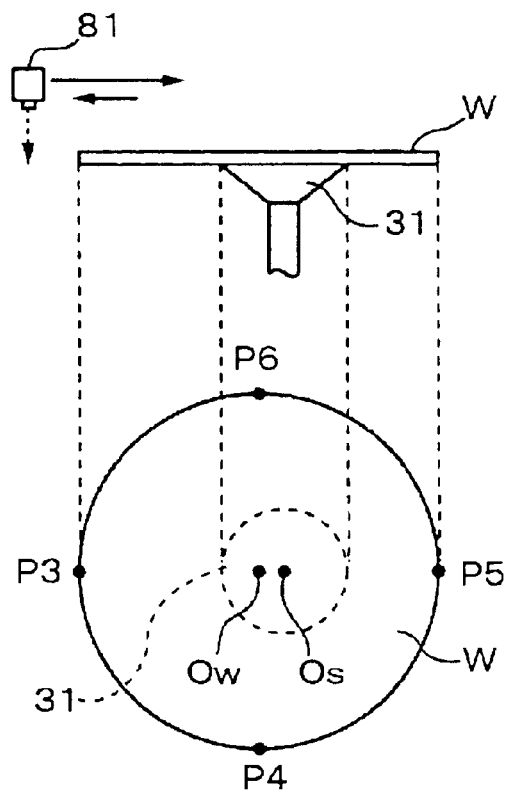
FIG. 12A is an explanatory view for explaining an alignment operation between a rotation center of a spin chuck and a center of a wafer.
Figure 12B:
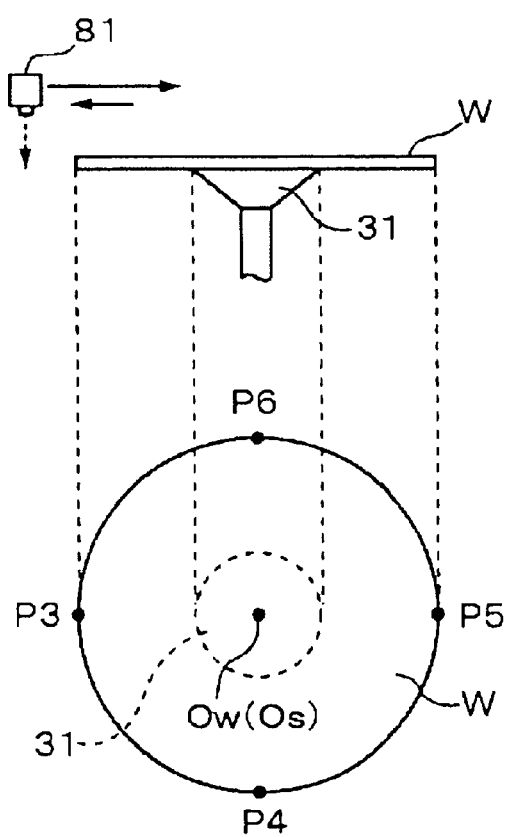
FIG. 12B is an explanatory view when the rotation center of the spin chuck and the center of the wafer coincide with each other in the alignment operation.

Subsequently, the main carrier mechanism A2 at the first transfer position transfers the wafer onto the spin chuck 31 of the coating unit 3A, and the alignment operation between the rotation center of the spin chuck 31 and the rotation center of the wafer is performed (Step S4). An example of the alignment operation will be described with reference to FIG. 12. In FIG. 12, a numeral 81 denotes a transmission-type sensor configured to be movable back and forth in the radial direction of the wafer W by a not-shown drive mechanism, for example, a pulse-step motor above the wafer W held on the spin chuck 31. When the main carrier mechanism A2 at the first transfer position transfers the wafer W onto the spin chuck 31, this transmission-type sensor 81 is carried into the coating unit 3A via the carrier opening 41. Then, the transmission-type sensor 81 is moved in the transverse direction at a predetermined speed from the outside of the edge of the wafer W to pass above the edge of the wafer W.

Next, the transmission-type sensor 81 is returned to a point before the position through which light passes, and the transmission-type sensor 81 is moved back slowly, for example, at one pulse interval for increased accuracy to detect the edge of the wafer. Further, the wafer W is rotated about the vertical axis at 90-degree increments three times, in respective states of which the processing similar to the above is performed, so that the position of a center Ow of the wafer W is found by calculation based on the positional data on four points (P3, P4, P5, P6) at the edge of the wafer W obtained from the processing. Then, repositioning (retrying) of the wafer is conducted until the center Ow of the wafer W coincides with a center Os of the rotation axis of the spin chuck 31 or its displacement from the rotation axis of the spin chuck 31 falls within an allowable range (see FIG. 12B). In this event, the displacement decreases as the retrying is conducted, converging after several times retrying.

The transfer position of the main carrier mechanism A2 obtained when alignment between the center Os of the rotation axis of the spin chuck 31 and the rotation center Ow of the wafer W is performed and the centers are aligned with each other is regarded as a precise transfer position (a second transfer position), and positional coordinate data on the position is acquired in a memory of the control unit C. In actual processing, the main carrier mechanism A2 is moved to the second transfer position to transfer the wafer W to/from the spin chuck 31 of the coating unit 3A.

The alignment operation of the main carrier mechanism A2 is performed with respect to the other processing units in the tower T4 in a similar manner, but in this case the alignment of each of the main carrier mechanisms A2 and A3 can be performed similarly to the above-described manner by grasping the positions of the carrier openings 41 of the other processing units and the first and second marks 7A and 7B in advance. The similar alignment operation is performed for the towers T1 and T2 with respect to the main carrier mechanism A2 and the towers T2, T3, and T5 with respect to the main carrier mechanism A3.

A first program of detecting the first mark 7A by the optical sensor 6 to find the correction amount in the vertical direction from the initial position of the main carrier mechanism A2 or A3 to the first transfer position based on the detection value, and detecting the second mark 7B to find the correction angle in the θ-direction from the initial position of the main carrier mechanism A2 or A3 to the first transfer position based on the detection value; a second program of moving the main carrier mechanism A2 or A3 in the vertical direction from the initial position by the correction amount found by the aforementioned first program and rotating it in the θ-direction by the correction angle, so that the main carrier mechanism A2 or A3 is moved to the first transfer position to face the carrier opening of the processing unit; and a third program of acquiring data on the second transfer position of the main carrier mechanism A2 or A3, are stored in the control unit C, so that the alignment operation of the main carrier mechanisms A2 and A3 is performed based on these programs.

In the above-described embodiment, even through the carrier opening 41 is narrow and has the smallest possible size for the main carrier mechanism A2 or A3 holding the wafer W to be able to enter and exit, the main carrier mechanism A2 or A3 can reliably enter and exit through the carrier opening 41 and transfer the wafer to/from the mounting table of the processing unit without the wafer W or the main carrier mechanism A2 or A3 colliding with a portion in the vicinity of the carrier opening 41 since the first transfer position of the main carrier mechanism A2 or A3 is determined after confirmation of the position of the carrier opening 41.

Since the position in the lateral direction of the carrier opening 41 is obtained using the first mark 7A and the position in the vertical direction of the carrier opening 41 is obtained using the second mark 7B in grasping the position of the carrier opening 41, the positional coordinate in the vertical direction and the positional coordinate in the lateral direction of the predetermined position of the carrier opening 41 can be precisely found even through the main carrier mechanisms A2 and A3 are of a type which is configured to be ascendable and descendable, rotatable about the vertical axis, and movable back and forth and thus has difficulty in confirming the edge portions in the lateral direction of the carrier opening 41 and the detecting means is the optical sensor 6. Accordingly, a less expensive detecting means can be advantageously employed for the alignment operation of the main carrier mechanisms A2 and A3.

Further, the alignment between the rotation center of the spin chuck 31 and the center of the wafer W is performed after the first transfer position is found to find the precise transfer position of the main carrier mechanism A2 or A3 with respect to the mounting table of the processing unit, so that in actual processing the wafer W is transferred to the spin chuck 31 with the rotation center of the spin chuck 31 and the center of the wafer reliably aligned.

This allows unnecessary coating film at the edge portion of the wafer W to be removed in the edge rinse process of the coating unit 3A, whereby the device region of the wafer W can advantageously occupy an area as large as possible, as close as possible to the outer edge of the wafer.

In the above configuration, it is also adoptable to directly detect the carrier opening 41 by the optical sensor 6 instead of grasping the position in the vertical direction of the carrier opening 41 by detecting the second mark 7B in the present invention. In this case, when the optical sensor 6 emits light toward a region in the vicinity of the carrier opening 41, the light is reflected within a region other than an opening region of the carrier opening 41 and the reflected light is received by the optical sensor 6, while the light is not reflected within the opening region of the carrier opening 41 and no reflected light is returned to the optical sensor 6, whereby the formation region of the carrier opening 41 is recognized by the presence or absence of reception of the reflected light. Accordingly, the positions of the edge portions in the vertical direction of the carrier opening 41 are detected by the optical sensor 6, whereby, from their positional coordinates, the positional coordinate of a predetermined position of the carrier opening 41, for example, the center position in the vertical direction can be calculated by the control unit C.

Besides, the configuration of the first mark 7A and the second mark 7B of the present invention is not limited to the above, but any configuration is applicable as long as it is one in which predetermined positions of the first and second marks 7A and 7B are detected by the optical sensor 6.

Figure 13A:
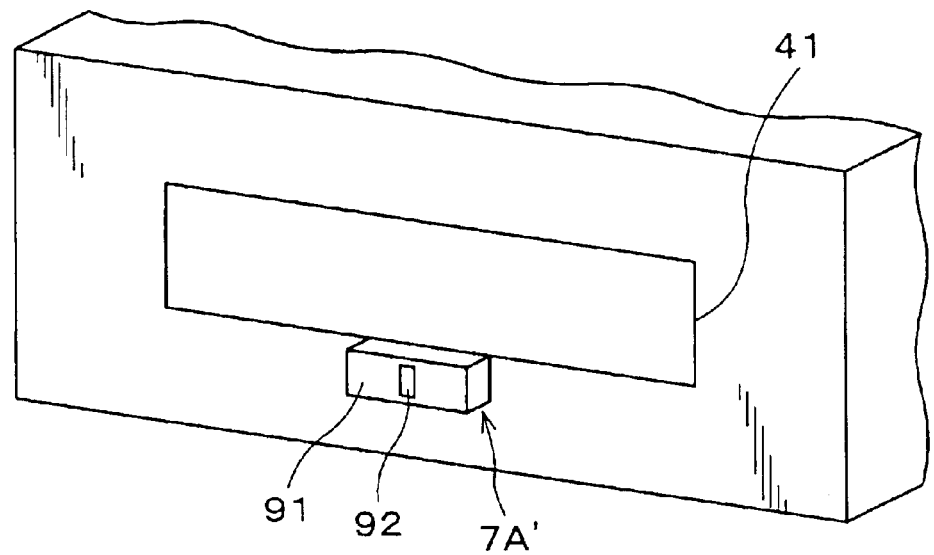
FIG. 13A is a perspective view of a first optical detection mark according to another embodiment provided at a carrier opening.

It is possible to propose, for example, a first mark 7A' in a box shape as shown in FIG. 13A having a slit 92 formed in a diffuser panel 91 and a supporting plate 93 parallel to the diffuser panel 91 which is provided behind the diffuser panel 91. The width of the slit 92 of the first mark 7A' is set to be the length between the above-described positions P1 and P2. Further, a region 94 of the supporting plate 93 corresponding to the slit 92 has been subjected to processing for antireflection, for example, matte black finish on the surface.

Figure 13B:
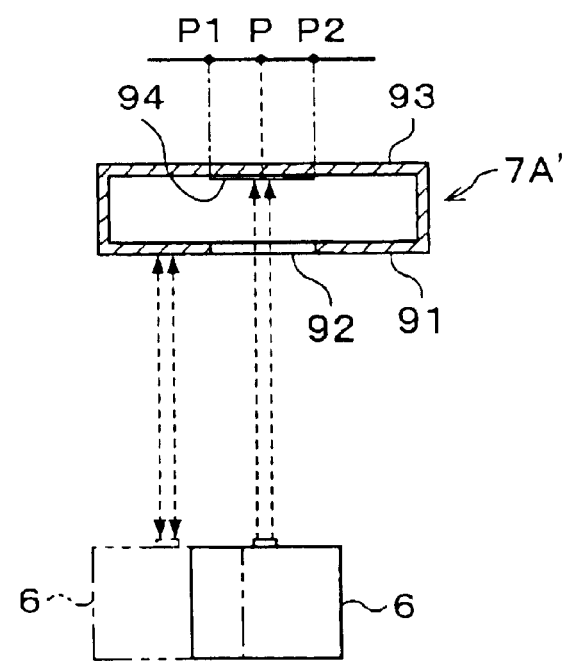
FIG. 13B is a transverse sectional view showing a reflection state at the first optical detection mark according to the other embodiment.
Figure 14:
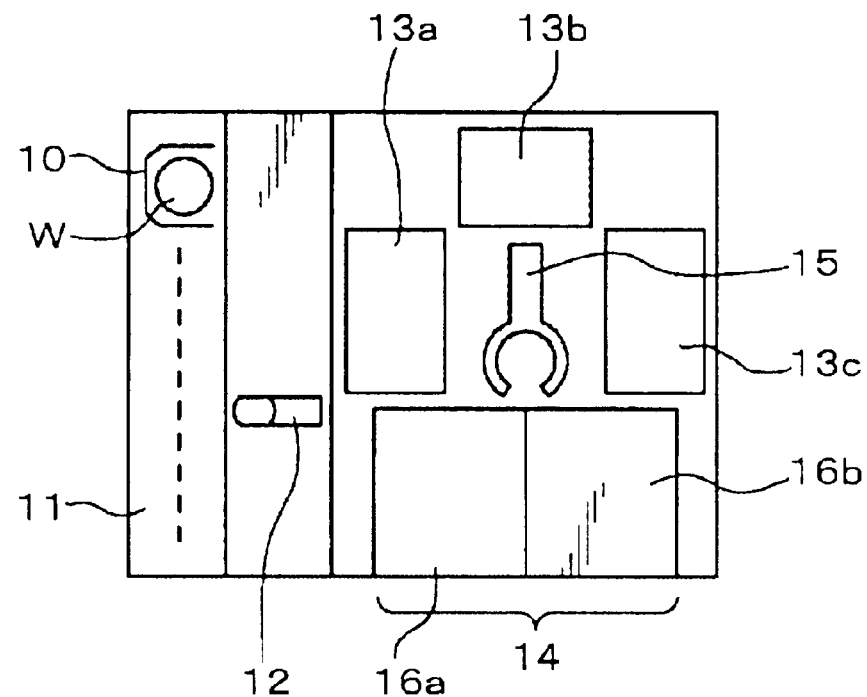
FIG. 14 is a plan view for explaining a conventional substrate processing apparatus.
Figure 15:
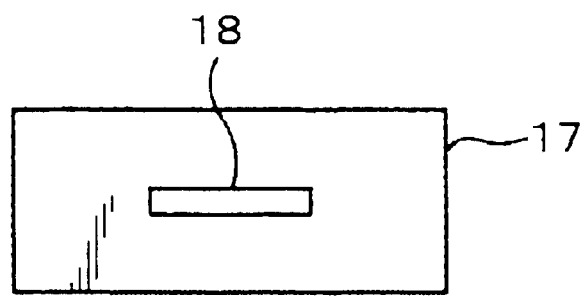
FIG. 15 is a front view showing a carrier opening of a processing unit provided in the conventional substrate processing apparatus.
Figure 16:
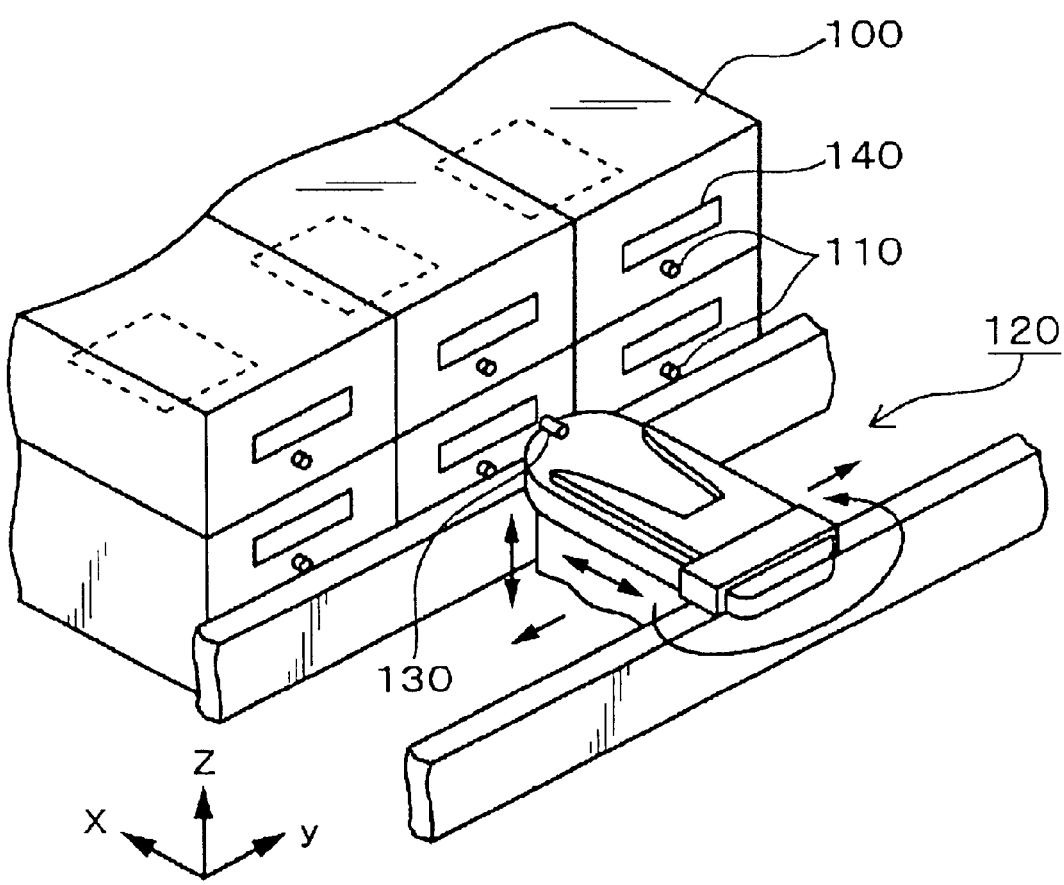
FIG. 16 is a perspective view for explaining an alignment method of a conventional carrier apparatus described in a document.

With the first mark 7A' in the above-described configuration, where the optical sensor 6 is located at a position facing the direct front of the slit 92 of the first mark 7A', light emitted from the optical sensor 6 toward the first mark 7A' passes through the slit 92 and strikes the region 94 as shown in FIG. 13B, and the light is absorbed there, with no reflected light returning to the optical sensor 6. On the other hand, where the optical sensor 6 is located at a position off the front of the slit 92 of the first mark 7A', light emitted from the optical sensor 6 toward the first mark 7A' strikes the diffuser panel 91 located on both sides of the slit 92, and the light is reflected by the diffuser panel 91 to return to the optical sensor 6 and be received by the optical sensor 6.

Note that while the first mark 7A' in this example is in a hollow box shape, any mark is employable as long as it has no particular supporting plate but has a non-reflection region within a region corresponding to the slit 92.

In addition to the above, it is also adoptable to employ a configuration in which the regions where the first and second marks 7A and 7B are provided are recognized by reflecting the light from the optical sensor 6 by the marks 7A and 7B, that is, the optical sensor 6 receives the reflected light when the optical sensor 6 is located at a position facing the direct front of the marks 7A and 7B. Further, the positions where the first and second marks 7A and 7B are attached are not limited to the above-described configuration, but the first and second marks 7A and 7B may be provided at locations separate from each other, or a plurality of marks 7A and 7B may be attached to each of the towers T1 to T5. Furthermore, a reflection-type sensor may be used in place of the transmission-type sensor 81 which is used for aligning the wafer W with the center position of the spin chuck 31.

The substrate used in the present embodiments in the foregoing may be a flat panel display substrate. Besides, in the substrate processing apparatus of the present invention, not only for the above-described processing process, a hydrophobic unit may be provided in place of the antireflection film forming unit or other units may be provided.

According to the present invention, when a substrate is transferred to a mounting table in a processing unit using a substrate carrier apparatus which is rotatable about the vertical axis, movable back and forth, and ascendable and descendable, alignment of the substrate carrier apparatus with a predetermined position on the mounting table in the processing unit can be accurately performed.

What is claimed is:

1. A substrate processing apparatus comprising a substrate carrier apparatus rotatable about a vertical axis, movable back and forth, and ascendable and descendable; towers placed along a rotational direction of said substrate carrier apparatus, each of said towers being constituted of a plurality of processing units tiered; and a carrier opening formed in an exterior casing of each of said processing units for allowing said substrate carrier apparatus holding a substrate to be carried into/out of each of said processing units, for acquiring data on a transfer position of said substrate carrier apparatus with respect to a predetermined position on a mounting table in said processing unit in adjusting said substrate processing apparatus, said apparatus comprising:

a first optical detection mark provided on an outer surface of said exterior casing and having a predetermined positional coordinate in a lateral direction with respect to said carrier opening;

a second optical detection mark provided on the outer surface of said exterior casing and having a predetermined positional coordinate in a vertical direction with respect to said carrier opening;

an optical sensor provided on said substrate carrier apparatus for detecting said first or second optical detection mark; and a control unit including a program of rotating said substrate carrier apparatus by a predetermined angle from a position of said substrate carrier apparatus where said optical sensor detects said first optical detection mark, and moving said substrate carrier apparatus in the vertical direction by a predetermined amount of movement from a position of said substrate carrier apparatus where said optical sensor detects said second optical detection mark, to allow said substrate carrier apparatus to face said carrier opening of said processing unit; and a program of allowing said substrate carrier apparatus to enter said processing unit after said substrate carrier apparatus faces said carrier opening and to perform an operation of acquiring data on a precise transfer position when transferring the substrate to the predetermined position on said mounting table.

2. A substrate processing apparatus comprising a substrate carrier apparatus rotatable about a vertical axis, movable back and forth, and ascendable and descendable; towers placed along a rotational direction of said substrate carrier apparatus, each of said towers being constituted of a plurality of processing units tiered; and a carrier opening formed in an exterior casing of each of said processing units for allowing said substrate carrier apparatus holding a substrate to be carried into/out of each of said processing units, for acquiring data on a transfer position of said substrate carrier apparatus with respect to a predetermined position on a mounting table in said processing unit in adjusting said substrate processing apparatus, said apparatus comprising:

a first optical detection mark provided on an outer surface of said exterior casing and having a predetermined positional coordinate in a lateral direction with respect to said carrier opening;

an optical sensor provided on said substrate carrier apparatus for detecting said first optical detection mark; and a control unit including a program of rotating said substrate carrier apparatus by a predetermined angle from a position of said substrate carrier apparatus where said optical sensor detects said first optical detection mark, and moving said substrate carrier apparatus in the vertical direction by a predetermined amount of movement from a position of said substrate carrier apparatus where said optical sensor detects edge portions in the vertical direction of said carrier opening, to allow said substrate carrier apparatus to face said carrier opening of said processing unit; and a program of allowing said substrate carrier apparatus to enter said processing unit after said substrate carrier apparatus faces said carrier opening and to perform an operation of acquiring data on a precise transfer position when transferring the substrate to the predetermined position on said mounting table.

3. The substrate processing apparatus as set forth in claim 1, wherein:

said first optical detection mark is provided such that a length direction thereof is perpendicular to a length direction of said carrier opening; and said second optical detection mark is provided such that a length direction thereof is parallel to the length direction of said carrier opening.

4. The substrate processing apparatus as set forth in claim 1, wherein said processing unit supplies a treatment solution onto a front face of a substrate mounted on said mounting table while rotating said mounting table about the vertical axis to thereby perform processing for the substrate.

5. The substrate processing apparatus as set forth in claim 1, wherein the precise transfer position where the substrate is transferred to the predetermined position on said mounting table in said processing unit is a position where said substrate carrier apparatus transfers the substrate to said mounting table with a rotation center of said mounting table and a rotation center of the substrate being aligned with each other.

6. The substrate processing apparatus as set forth in claim 1, wherein said first optical detection mark has a diffuser panel and a protruding body.

7. The substrate processing apparatus as set forth in claim 1, wherein said first optical detection mark has a diffuser panel including a slit and a supporting plate including a non-reflection region at a position corresponding to the slit.

8. The substrate processing apparatus as set forth in claim 2, wherein said first optical detection mark has a diffuser panel and a protruding body.

9. The substrate processing apparatus as set forth in claim 2, wherein said first optical detection mark has a diffuser panel including a slit and a supporting plate including a non-reflection region at a position corresponding to the slit.

10. A method of aligning a substrate carrier apparatus with a predetermined position on a mounting table in a processing unit in adjusting a substrate processing apparatus, the substrate processing apparatus comprising the substrate carrier apparatus rotatable about a vertical axis, movable back and forth, and ascendable and descendable; towers placed along a rotational direction of the substrate carrier apparatus, each of the towers being constituted of a plurality of processing units tiered; and a carrier opening formed in an exterior casing of each of the processing units for allowing the substrate carrier apparatus holding a substrate to be carried into/out of each of the processing units, said method comprising the steps of:

detecting a first optical detection mark provided on an outer surface of the exterior casing and having a predetermined positional coordinate in a lateral direction with respect to the carrier opening by an optical sensor provided on the substrate carrier apparatus to find a correction angle in the lateral direction from a position of the substrate carrier apparatus where the optical sensor detects the first optical detection mark to a transfer position where the substrate carrier apparatus faces the carrier opening of the processing unit;

detecting a second optical detection mark provided on the outer surface of the exterior casing and having a predetermined positional coordinate in a vertical direction with respect to the carrier opening by the optical sensor provided on the substrate carrier apparatus to find a correction amount in the vertical direction from a position of the substrate carrier apparatus where the optical sensor detects the second optical detection mark to the transfer position where the substrate carrier apparatus faces the carrier opening of the processing unit;

subsequently rotating the substrate carrier apparatus by the correction angle from the position of the substrate carrier apparatus where the optical sensor detects the first optical detection mark, and moving the substrate carrier apparatus in the vertical direction by the correction amount from the position of the substrate carrier apparatus where the optical sensor detects the second optical detection mark, to allow the substrate carrier apparatus to face the carrier opening of the processing unit; and allowing the substrate carrier apparatus to enter the processing unit after the substrate carrier apparatus faces the carrier opening and to acquire data on a precise transfer position when transferring the substrate to the predetermined position on the mounting table.

11. A method of aligning a substrate carrier apparatus with a predetermined position on a mounting table in a processing unit in adjusting a substrate processing apparatus, the substrate processing apparatus comprising the substrate carrier apparatus rotatable about a vertical axis, movable back and forth, and ascendable and descendable; towers placed along a rotational direction of the substrate carrier apparatus, each of the towers being constituted of a plurality of processing units tiered; and a carrier opening formed in an exterior casing of each of the processing units for allowing the substrate carrier apparatus holding a substrate to be carried into/out of each of the processing units, said method comprising the steps of:

detecting a first optical detection mark provided on an outer surface of the exterior casing and having a predetermined positional coordinate in a lateral direction with respect to the carrier opening by an optical sensor provided on the substrate carrier apparatus to find a correction angle in the lateral direction from a position of the substrate carrier apparatus where the optical sensor detects the first optical detection mark to a transfer position where the substrate carrier apparatus faces the carrier opening of the processing unit;

detecting edge portions in the vertical direction of the carrier opening by the optical sensor provided on the substrate carrier apparatus to find a correction amount in the vertical direction from a position of the substrate carrier apparatus where the optical sensor detects the edge portions in the vertical direction of the carrier opening to the transfer position where the substrate carrier apparatus faces the carrier opening of the processing unit;

subsequently rotating the substrate carrier apparatus by the correction angle from the position of the substrate carrier apparatus where the optical sensor detects the first optical detection mark, and moving the substrate carrier apparatus in the vertical direction by the correction amount from the position of the substrate carrier apparatus where the optical sensor detects the edge portions in the vertical direction of the carrier opening, to allow the substrate carrier apparatus to face the carrier opening of the processing unit; and allowing the substrate carrier apparatus to enter the processing unit after the substrate carrier apparatus faces the carrier opening and to acquire data on a precise transfer position when transferring the substrate to the predetermined position on the mounting table.

\* \* \* \* \*